United States Patent [19]

Kojima et al.

[11] Patent Number: 4,842,968

[45] Date of Patent: Jun. 27, 1989

[54] HOLOGRAM RECORDING MEDIUM

[75] Inventors: Chiaki Kojima; Hidetoshi Shimizu, both of Kanagawa, Japan

[73] Assignee: Sony Corporation, Tokyo, Japan

[21] Appl. No.: 809,009

[22] Filed: Dec. 16, 1985

[30] Foreign Application Priority Data

Dec. 14, 1984 [JP] Japan .................. 59-264241

[51] Int. Cl.$^4$ .......... G03C 5/16; G03C 1/68; G03H 1/04

[52] U.S. Cl. .......................... 430/1; 430/2; 430/281; 430/290; 522/23; 522/20; 522/79; 522/80; 522/172

[58] Field of Search .................. 430/1, 2, 281, 290

[56] References Cited

U.S. PATENT DOCUMENTS 3,850,633 11/1974 Moraw et al. .................. 430/1
4,173,474 11/1979 Tanaka et al. .................. 430/2 X
4,173,475 11/1979 Chandross et al. ............. 430/285 X

FOREIGN PATENT DOCUMENTS 0164702 8/1985 Japan .................. 430/1
0176002 9/1985 Japan .................. 430/2

Primary Examiner—Paul R. Michl
Assistant Examiner—Cynthia Hamilton
Attorney, Agent, or Firm—Hill, Van Santen, Steadman & Simpson

[57] ABSTRACT

There is disclosed herein a hologram recording medium comprising of substrate formed of transparent and non-light scattering material having a plurality of open pores for said substrate and photopolymerization composition impregnated in said open pores. The photopolymerization composition consists essentially of a photopolymerizable monomer or oligomer which adheres to the surface of said open pores, a photopolymerization initiator and activator for controlling the photopolymerization speed.

11 Claims, No Drawings

HOLOGRAM RECORDING MEDIUM

BACKGROUND OF THE INVENTION

This invention concerns a hologram recording medium and, particularly, relates to a volume phase hologram recording medium.

The material used for recording volume phase holograms includes dichromated gelatines (hereinafter referred to as DCG), bleached silver halide photographic emulsions, photosensitive polymers and inorganic dielectric materials such as $LiNbO_3$.

Recording mediums using organic polymeric materials generally provide high varying refractive indices and photo-induced cross-linking reactions or photo-induced change of the materials also occurs, which results in dimensional instability or large shrink-expansion stresses that cause distortion in the interference pattern. Accordingly, there is a drawback that such organic polymeric materials are not suitable for use where a high accuracy interfernece pattern is required.

On the other hand, inorganic dielectric materials have a drawback that the varying refractive indices are lower as compared with those of the organic materials, although their dimensional stability is excellent.

In order to overcome the foregoing drawbacks, there has been proposed in U.S. Pat. No. 4,187,111, a composite system hologram comprising a porous glass material and a highly polymeric monomer. In the proposed hologram, pores of a porous substrate are filled with a photopolymerization initiator and an image exposed, that is, a holographic exposure of a predetermined pattern to form a pattern composed of a portion forming radicals and a portion not forming them, followed by developing treatment. In the developing treatment, the pores of the substrate are filled with a monomer and, thereafter, the monomer in the pores is selectively polymerized by the entire exposure at the above-mentioned radical-forming pattern, thereby preparing a varying refractive index of a required pattern, that is, an interference lattice.

In this hologram, however, the adhesion strength of the photopolymerizable monomer or the photopolymerization initiator to the pores of the porous substrate cannot be increased, aging degradation has resulted in the varying refractive index after the formation of the hologram.

It is the object of this invention to provide a hologram recording medium which uses a composite system comprising a porous material and a photopolymerizable monomer, which has excellent dimensional stability, of a relatively large varying refractive index and capable of overcoming the aging degradation.

These and other objects of this invention will become apparent from the following description and appended claims.

SUMMARY OF THE INVENTION

The hologram recording medium according to this invention comprises a substrate made of a transparent and non-light scattering porous material, and a photopolymerizable composition comprising a polymerizable monomer or oligomer, which adhere to the surface of pores in the substrate and is capable of photopolymerization, a photopolymerization initiator and an inactivator for controlling the photopolymerization reaction rate.

In recording the hologram on the hologram recording medium, image exposure, e.g., by an argon laser beam, a pattern exposure is conducted. The monomer material in the non-exposed area is eliminated by a solvent therefor to effect fixing treatment for the development. The solvent used herein will not dissolve the polymer system in the exposed light area and will only dissolve the monomer system in the non-exposed dark area. Then, by applying a vacuum drying treatment under a room temperature, a hologram can be obtained.

It has been confirmed for the hologram thus obtained, by a liquid index matching test, that the pores are present in the non-exposed dark area, while a polymer is formed in the exposed bright area, whereby a high diffraction efficiency due to the varying refractive index can be obtained.

A stable material with a refractive index different from that of the resulting polymer can be filled as required into the above-mentioned pores of the hologram. When the hologram formed with a variation in the refractive index between a high refractive index region (exposed light region) and a low refractive index (non-exposed dark region) is immersed into a liquid having a refractive index identical with that of the high refractive index region, the variation in the refractive index is eliminated, by which the diffraction efficiency is lost. In this situation it is said that the hologram is brought into index matching with the liquid.

DESCRIPTION OF THE PREFERRED EMBODIMENT

The porous material in the hologram recording medium according to this invention has such a high boiling point that the material does not evaporate in the production step of the recording medium, as well as during recording and/or reproducing treatment and the material has the porous structure in which the pores are not confined. That is, they are not closed pores but rather open pores, for example, in communication with each other and connected to the outer surface.

Porous material used herein is selected from those having the open pore size of less than 500 Å, in view of the requirements of interference pattern recording of eliminating the light-scattering property and ensuring the diffusion and the retainability of the photopolymerizable monomer in the pores and, preferably, those having a large adhesive strength desirably by chemisorption with the monomer filled therein. The porous material usable herein can include, for example, porous VYCOR glass #7930 (manufactured by Corning Co., hereinafter referred to as thirsty glass). The thirsty or porous glass is suitable as the porous material for the composite system hologram since it has an average pore size of 40 Å, a light transmittance of more than 90 percent to the wavelength of greater than 4000 Å and has a high stiffness with the elastic coefficient of $1.8 \times 10^5$ $kg/cm^2$. It is suitable that the thickness of the thirsty glass substrate is less than 1 mm in most of the hologram elements. Further, the thirsty glass has a large specific surface area of 250 $m^2/g$ when measured according to the BET method and thus a high absorptivity. It is necessary, before use, to immerse the glass material into an aqueous 30 percent solution of hydrogen peroxide, which has been washed with deionized water and then vacuum dry the glass at about 60° C.

The photopolymerizable monomer material is selected from those monomers having a large adhesion strength to the pore walls of the thirsty glass, that is, those having functional groups with a high affinity to the glass. For example, hydrophilic polar groups or having groups capable of forming the aforementioned functional groups under the hydrolysis with the adhesive water on the glass surface, and having such a high boiling point, for example, above 100° C., that they are not eliminated out of the system through evaporation from the pores until the recording for the interference pattern is completed. Further, it is practically important that the photopolymerizable monomer can be photopolymerized with a light, particularly at the oscillating wavelength of the laser beams, for example, used for the hologram pattern exposure and that the monomer has a high quantum yield in the photopolymerization reaction. Those monomers of the silane coupling agent type having ethylenically unsaturated double bonds or of the titanium coupling agent type can be used. It is possible to select the wavelength capable of recording by adding an appropriate sensitizer to the photopolymerizable monomer. The photopolymerizable monomer having a boiling point higher than 100° C. (ethylenically unsaturated monomer) usable herein can include those monofunctional monomers such as acrylic acid, methacrylic acid, methyl methacrylate, butyl acrylate, cyclohexyl acrylate, dimethylaminoethyl methacrylate, benzyl acrylate, carbitol acrylate, 2-ethylhexyl acrylate, 2-ethylhexyl methacrylate, lauryl methacrylate, 2-hydroxyethyl acrylate, 2-hydroethyl methacrylate, 2-hydropropyl acrylate, 2-hydroxypropyl methacrylate, glycidyl methacrylate, methacrylamide, N,N'-methylene-bis-acrylamide and N-vinylpyrrolidone, or polyfunctional monomers such as ethyleneglycol diacrylate and trimethylolpropane triacrylate.

The photopolymerization initiator usable herein can include diacetyl benzoin, benzoin methyl ether, azoisobutyronitrile, triphenylphosphine, benzophenone-triethylamine, and the like.

During photopolymerization reaction in the thirsty glass with the photopolymerizable monomer and the polymerization initiator, since non-transparent products are formed due to the increase in the degree of polymerization and the increase in the polymer yield along with the proceeding of the reaction and they possibly cause light scattering, an inactivator is added for avoiding the generation of such products. The inactivator is selected from those materials having compatibility with the reactive monomer, high boiling point and high viscosity for providing the controlling effect on the reaction rate and having a triplet interaction with the reaction initiator. For the compatibility between two kinds of molecules, it is said that the molecules having solubility parameters (S.P. values) close to each other are in good compatibility. The S.P. value is defined as E/V where E represents the cohesive energy of a molecule and V represents the volume of the molecule. The reaction initiator is excited to a triplet state by ultraviolet rays, for example, of Ar laser upon hologram pattern exposure and the monomer is polymerized by the energy emitted when it returns to the ground state. A portion of the energy released from the reaction activator is absorbed into the inactivator to excite the same into the triplet state, and the inactivator, in turn, dissipates the energy in the form of heat, to eventually provide the effect of controlling the monomer polymerization reaction. Thus, the inactivator is selected in view of the foregoing. The inactivator usable herein can include 1-phenylnapthalene, olive oil, or the like.

It is desirable that the photopolymerizable composition comprises from 75 to 85 percent by volume of the polymerizable monomer and from 25 to 15 percent by volume of the inactivator as the balance. The reaction control is difficult if the monomer exceeds 85 percent by volume, and on the other hand, the reaction rate is retarded excessively if it is less than 75 percent by volume. Further, the reaction initiator is desirably selected from 0.5 to 2 percent by weight based on the monomer.

In the recording medium according to this invention as described above, since the monomer at the non-exposed area is eliminated to regenerate pores after the recording by the pattern exposure, a high refractive index difference can be obtained, to provide a high diffraction efficiency.

Example

One specific embodiment of the hologram recording medium according to this invention will now be explained.

A thirsty or porous glass plate of 1 mm thickness and 10 mm×10 mm size was prepared, which was washed with an aqueous 30 percent solution of hydrogen peroxide and then immersed for about two hours into a photopolymerizable monomer system comprising:
Monomer:
Silane coupling agent having ethylenically unsaturated double bonds. (This monomer is sold under the designation KBM-503 by Shinetsu Chemical Co.): 80 vol %
Inactivator:
1-phenylnaphthalene: 20 vol %
Polymerization initiator:
BME (benzoin methyl ether) 1 wt % based on the monomer. Then, it was subjected to an interference pattern exposure for five minutes using a light of wavelength at 3600 Å by argon laser. After the exposure, it was immersed in a tetrahydrofuran solvent under stirring for three hours and then dried under vacuum at a room temperature.

Since the silane coupling agent type monomer having ethylenically unsaturated double bond used in Example 1 (KBM-503 manufactured by Shinetsu Chemical Co.) has a high adhesive strength to glass due to the silanol coupling with glass and a boiling point as high as 255° C., it is securely retained within the pores. Further, the polymerization initiator BME has a high quantum yield to the ultraviolet laser beams, whereby the hologram can surely be formed.

The hologram obtained in Example 1 exhibits the diffraction efficiency of higher than 40 percent, which is not degraded when left under the ambient temperature and humidity for more than one year with no particular sealing and, therefore, has excellent stability and reliability.

By using the porous material having the pore size as large as possible within the above-mentioned restriction, a so-called photopolymerizable oligomer of a large molecular size can be used.

As described above, since the hologram recording medium according to this invention is constituted as a composite system comprising the porous material and the photopolymerizable monomer, it has excellent dimensional stability. Further, since the impregnation for the porous material substrate with the photopolymerizable composition may be effected only once, the production procedures can be simplified. Furthermore, by the hologram recording medium according to this invention and since the monomer is eliminated by the solvent after the pattern exposure, that is, after the recording to regenerate the pores in the substrate, a high varying refractive index can be obtained, thereby providing a hologram of higher diffraction efficiency.

Although the invention has been described with respect to preferred embodiments, it is not to be so limited as changes and modifications can be made which are within the full intended scope of the invention as defined by the appended claims.

I claim as my invention:

1. A hologram recording medium comprising a rigid substrate formed of transparent and non-light scattering material having a plurality of open pores in said substrate, photopolymerizable composition impregnated in said open pores, said photopolymerizable composition consisting essentially of: a photopolymerizable material selected from the group consisting of photopolymerizable monomers or photopolymerizable oligomers having an adhesive property to surface of said open pores; a photopolymerization initiator, and an inactivator for controlling photopolymerization speed, wherein said inactivator is a material having a triplet interaction with the photopolymerization initiator, where energy emitted by said photopolymerization initiator upon returning from an excited state by irradiation of light to a ground state is partially a triplet state, and said excited inactivator dissipates energy as heat upon returning to a ground state of said inactivator.

2. A hologram recording medium according to claim 1, wherein said photopolymerizable material has a hydrophilic functional group or a functional group to form a hydrophilic group upon hydrolysis and an ethylenically unsaturated double bond.

3. A hologram recording medium according to claim 1, wherein said photopolymerizable monomer or oligomer is employed in the range of 75 to 85 volume percent and said inactivator is 25 to 15 volume percent.

4. A hologram recording medium as in claim 1, wherein said porous material is an open-celled glass.

5. A hologram recording medium as in claim 2, wherein the open pore size is less than 500 Å.

6. A hologram recording medium as in claim 1, wherein the average pore size is about 40 Å.

7. A hologram recording medium as in claim 2, wherein said polymerizable monomer is selected from the group consisting of a silane coupling agent having an ethylenically unsaturated double bond and a titanium coupling agent.

8. A hologram recording medium as in claim 7, wherein said photopolymerizable monomer has a boiling point greater than 100° C.

9. A hologram recording medium as in claim 1, wherein the photopolymerization initiator is selected from the group consisting of diacetyl benzoin, benzoin methyl ether, azoisobutyronitrile, triphenylphosphine, and benzophenone-triethylamine.

10. A hologram recording medium comprising a rigid substrate formed of transparent and non-light scattering material having a plurality of open pores in said substrate, photopolymerizable composition impregnated in said open pores, said photopolymerizable composition consisting essentially of: a photopolymerizable material selected from the group of consisting of photopolymerizable monomers or photopolymerizable oligomers having an adhesive property to surface of said open pores; a photopolymerization initiator, and an inactivator for controlling photopolymerization speed; and said inactivator is a material having a triplet interaction with the photopolymerizable initiator; wherein said inactivator is selected from the group consisting of 1-phenylnapthalene and olive oil.

11. A hologram recording medium as in claim 3, wherein the initiator is between 0.5 and 2 percent weight based on the monomer.

* * * * *